(12) United States Patent
Alagaratnam et al.

(10) Patent No.: US 6,335,491 B1
(45) Date of Patent: Jan. 1, 2002

(54) INTERPOSER FOR SEMICONDUCTOR PACKAGE ASSEMBLY

(75) Inventors: Maniam Alagaratnam, Cupertino; Kishor V. Desai, Fremont; Sunil A. Patel, Los Altos, all of CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/499,801

(22) Filed: Feb. 8, 2000

(51) Int. Cl.[7] .............................. H05K 1/16; H05K 7/02
(52) U.S. Cl. ....................... 174/260; 174/261; 174/262; 361/760; 257/686; 257/738; 257/778
(58) Field of Search ................................ 174/260, 255, 174/256, 261, 262, 263, 266, 52.4; 361/760, 792, 793, 803, 704, 770; 257/698, 778, 692, 737, 686, 738, 773, 712, 779, 690, 697, 723, 734; 439/65, 66, 67, 68, 69, 74

(56) References Cited

U.S. PATENT DOCUMENTS

| | | | | |
|---|---|---|---|---|
| 3,541,222 A | * | 11/1970 | H. L. Parks et al. | 174/260 |
| 5,477,933 A | * | 12/1995 | Nguyen | 174/262 |
| 5,530,288 A | * | 6/1996 | Stone | 257/700 |
| 5,759,047 A | * | 6/1998 | Brodsky et al. | 439/66 |
| 5,834,848 A | * | 9/1998 | Iwasaki | 257/778 |
| 5,973,930 A | * | 10/1999 | Ikeda et al. | 361/768 |
| 6,002,168 A | * | 12/1999 | Bellaar et al. | 257/696 |
| 6,050,832 A | * | 4/2000 | Lee et al. | 439/91 |
| 6,059,579 A | * | 6/2000 | Kresge et al. | 439/66 |
| 6,088,915 A | * | 7/2000 | Turturro | 29/840 |
| 6,163,462 A | * | 12/2000 | Buck | 361/767 |

* cited by examiner

Primary Examiner—Albert W. Paladini
Assistant Examiner—J B Patel
(74) Attorney, Agent, or Firm—Beyer, Weaver & Thomas LLP

(57) ABSTRACT

The present invention describes an interposer which improves the thermal performance of a semiconductor device. The interposer may be situated between a substrate and a board. The interposer is attached to two layers of solder balls. The first layer of solder balls electrically and mechanically connects the interposer to the substrate. The second layer of solder balls electrically and mechanically connects the interposer to the board. In one aspect, the coefficient of thermal expansion (CTE) of the interposer may be flexibly selected to reduce thermal strain-induced stress for either or both layers of solder balls resulting from thermal performance differences between the substrate and the interposer or the interposer and the board. In another aspect, the CTE of the interposer may be reduced to allow a lower CTE for the substrate, which in turn may reduce thermal strain-induced stress for solder balls between the substrate and a die attached to the substrate. Advantageously, the improved thermal performance of the present invention may allow larger substrates, larger dies, larger solder ball arrays, reduced solder ball pitches and pin counts well above conventional levels without compromising semiconductor device reliability.

18 Claims, 3 Drawing Sheets

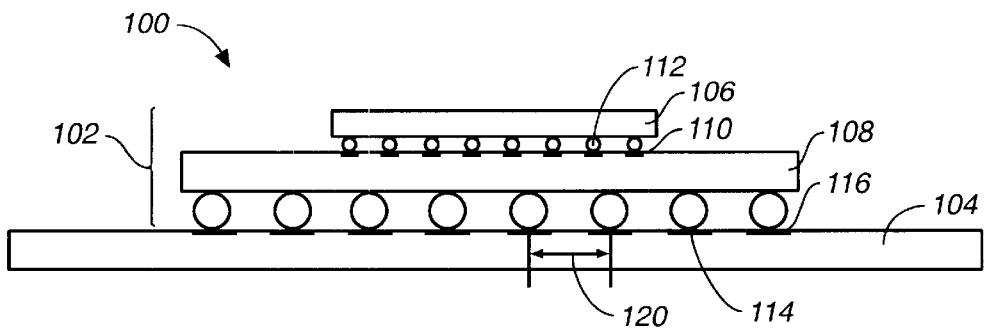
FIG._1A
(PRIOR ART)
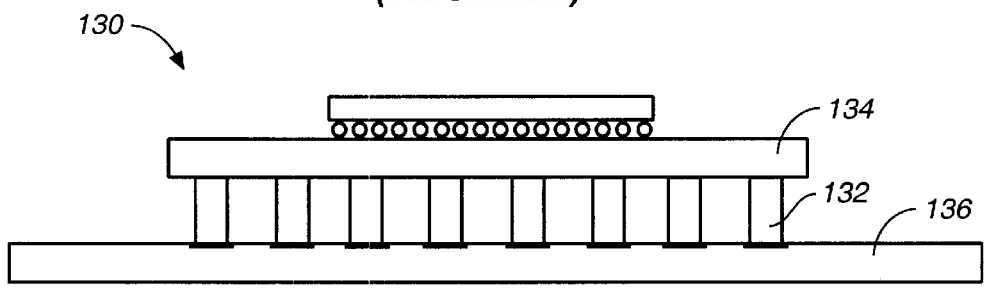
FIG._1B
(PRIOR ART)
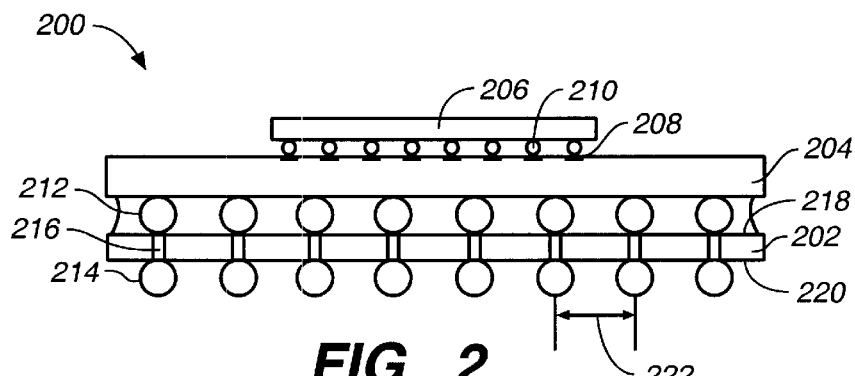
FIG._2
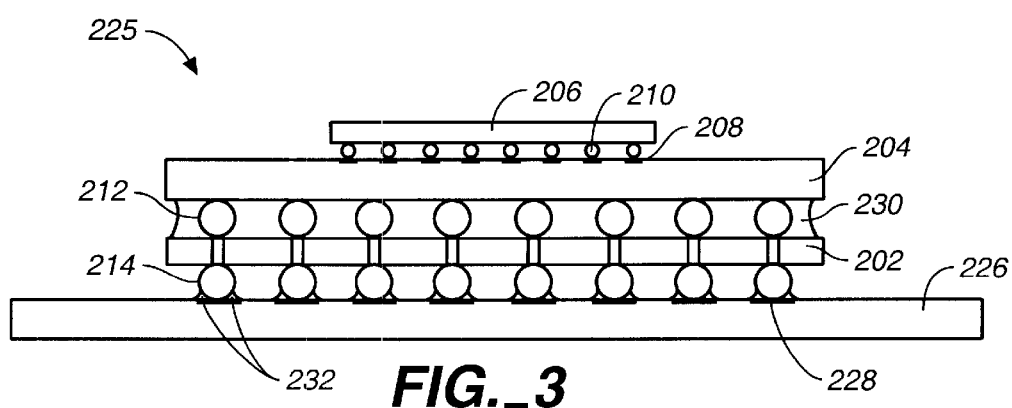
FIG._3

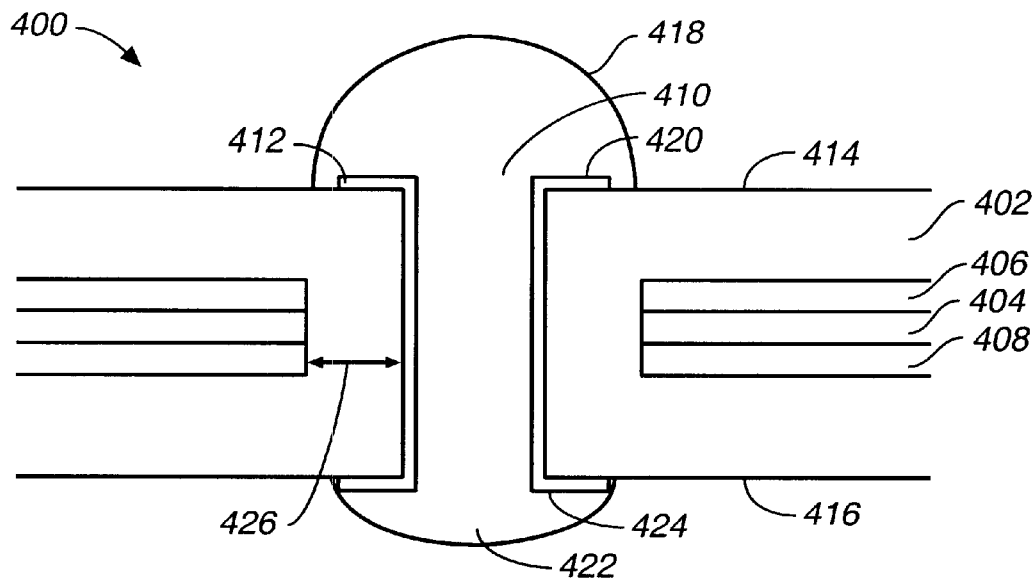
FIG._4A
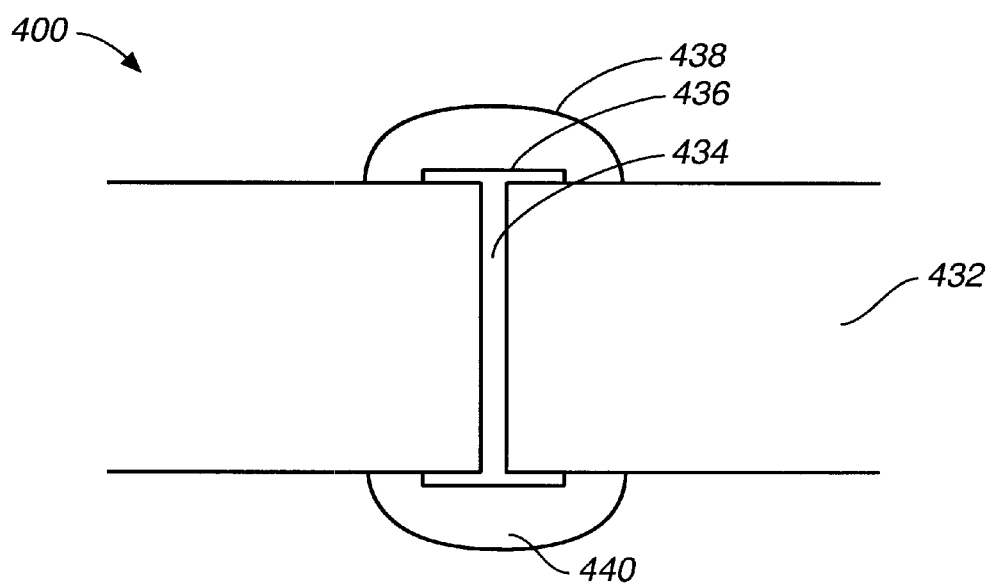
FIG._4B

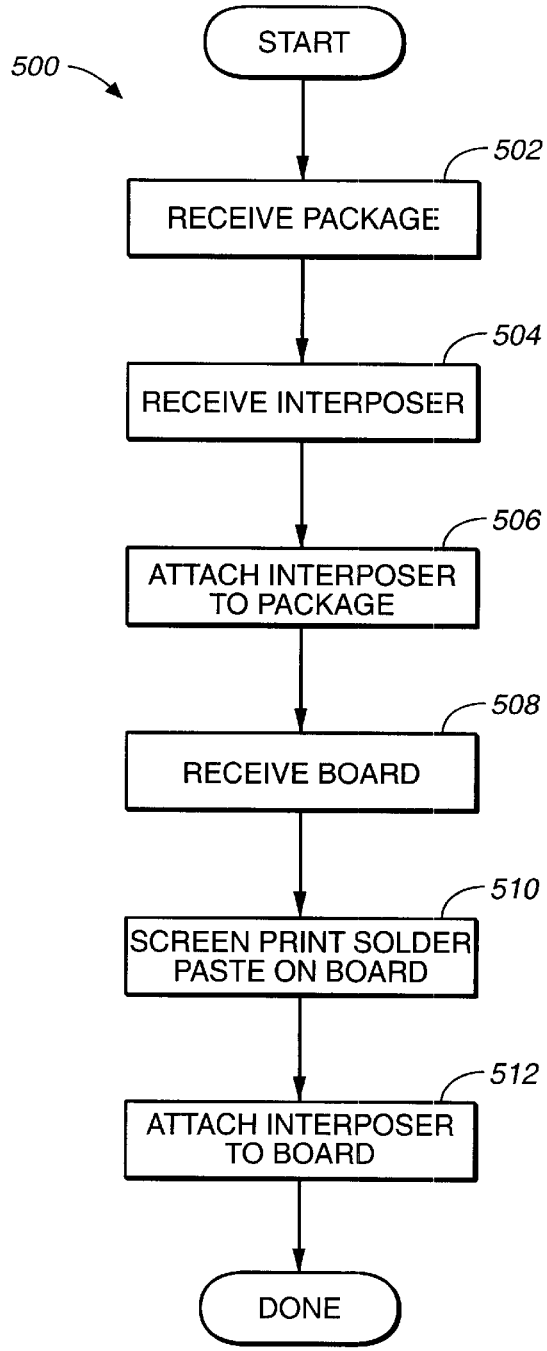
FIG._5
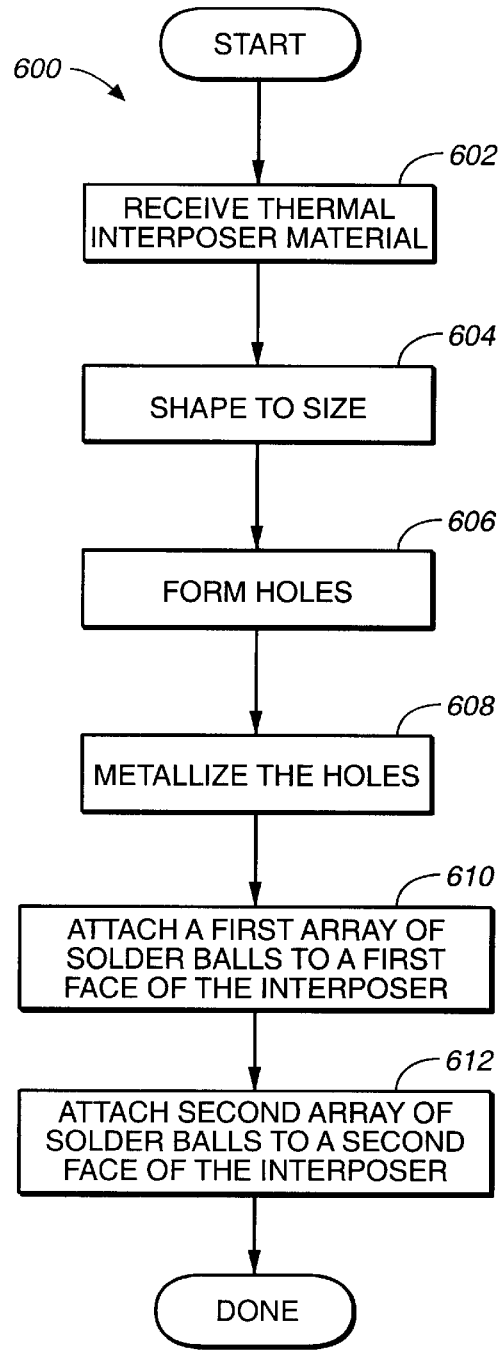
FIG._6

INTERPOSER FOR SEMICONDUCTOR PACKAGE ASSEMBLY

BACKGROUND OF THE INVENTION

This invention relates generally to semiconductor chip packages and assembly. More specifically, the invention relates to an interposer which improves the performance reliability of a package and permits larger substrates and higher pin counts.

In semiconductor device assembly, a package is typically attached to a board. FIG. 1A illustrates a conventional semiconductor device 100 which includes a package 102 attached to a printed circuit board 104. The package 102 includes a die 106 mounted upon a substrate 108. The substrate 108 includes bond pads 110 for receiving solder balls 112 which permit electrical communication between the substrate 108 and the die 106. The substrate 108 is mounted on the printed circuit board 104 using solder balls 114 at landings 116 included on the printed circuit board 104. The solder balls 114 provide electrical communication and mechanical attachment between the substrate 108 and the board 104. The distance between solder balls 114 is referred to as the solder ball pitch 120.

In the current semiconductor environment, a die is continually being called upon to sustain an increasing number of functions. As die complexity continues to increase, including applications having multiple functions, I/O communication with the die 106 must also suitably increase. The number of I/O connections between the substrate 108 and the die 106, or the substrate 108 and the board 104, is referred to as a 'pin count'. Designers are presently calling for pin counts in the range of up to two thousand pins. Current pin counts are limited by the size of the substrate 108 and the pitch 120. For the semiconductor device 100, the current substrate 108 size limit is 32 mm square and the current pitch 120 limit is 1.27 mm, resulting in a current pin count limit of 625 pins.

The size of the substrate 108 is currently limited by thermal performance considerations. More specifically, differences in the coefficients of thermal expansion between the die 106, the substrate 108 and the board 104 lead to differential expansion and contraction of these components during thermal cycling. This differential thermal strain creates substantial stress upon the solder balls 112 and the solder balls 114, which are fixed. By way of example, the substrate 108 may be comprised of a ceramic material having a coefficient of thermal expansion in the range of 6 parts per million (PPM). The board 104 may be comprised of a resin based material having a coefficient of thermal expansion in the range of 18 PPM. As the device 100 is expected to undergo constant thermal cycling during its operational lifetime, the thermal expansion differences between the substrate 108 and the board 104 may create substantial stress in the solder balls 114. This thermal strain-induced stress may cause the solder balls 114 to crack or lose contact, thereby compromising performance of the semiconductor device 100.

For the die 106, the substrate 108 and the board 104, the neutral point of thermal expansion is typically in the center of each component. As distance from the neutral point increases, thermal expansion effects increase. In other words, as distance from the neutral point increases, more pronounced are the effects of thermal strain-induced stress upon the solder balls 114 between the substrate 108 and the board 104. The stress upon the solder balls 114 at the periphery of the substrate 108 often limits the substrate 108 size. Thus, the substrate 108 size and pin count are limited by a thermal performance mismatch between the substrate 108 and the board 104.

Similar thermal performance difference problems exist for the solder balls 112 between the substrate 108 and the die 106. By way of example, the die 106 is typically comprised of silicon having a coefficient of thermal expansion in the range of 2–4 PPM. Although the distances from the furthest solder balls 112 to the neutral point for the substrate 108 are not as large as that for the solder balls 114 between the substrate 108 and the board 104, the thermal expansion and contraction differences between the substrate 108 and the die 106 may still compromise performance of the device 100. Thus, the substrate 108 size and pin count are further limited by thermal performance differences between the die 106 and the substrate 108.

One conventional solution to address the thermal performance differences between the substrate 108 and the board 104 is the use of solder columns in place of solder balls. FIG. 1B illustrates a ceramic column grid array (CCGA) 130 including columns 132 which extend from a substrate 134 to a printed circuit board 136. The CCGA 130 increases the height between the substrate 134 and the board 136 to about 100 mils from the conventional 30 mils of FIG. 1A. By increasing the height of the connection, the compliance of the connection between the substrate 134 and the board 136 is increased. This increased compliance results in lower stresses for peripheral columns and thus permits a larger substrate 134, and more columns 132.

While the CCGA 130 permits a substrate size up to a maximum of 44 mm square and a pin count in the range of 1600–1700 pins, there are several problems with this design. Firstly, the geometry of the columns introduces fragility to the CCGA 130. As a result, extensive care must be taken while handling the CCGA 130 at the risk of fracturing one or more columns 132. As the CCGA 130 is often shipped in component form to various manufacturers, this fragility represents an obstacle to CCGA 130 acceptability. Secondly, as mentioned before, pin count requirements in some desired applications are in range of 2000 pins, which is outside the allowable limit of the CCGA 130. Thus, the CCGA 130 is not suitable for increasing I/O demands of modern semiconductor devices.

In view of the foregoing, a semiconductor device which may improve thermal performance differences between its components would be desirable. In addition, a semiconductor device which may accommodate increased pin counts would also be desirable.

SUMMARY OF THE INVENTION

To achieve the foregoing, the present invention describes an interposer which improves the thermal performance of a semiconductor device. The interposer may be situated between a substrate and a board. The interposer is attached to two layers of solder balls. The first layer of solder balls electrically and mechanically connects the interposer to the substrate. The second layer of solder balls electrically and mechanically connects the interposer to the board. In one aspect, the coefficient of thermal expansion (CTE) of the interposer may be flexibly selected to reduce thermal strain-induced stress for either or both layers of solder balls resulting from thermal performance differences between the substrate and the interposer or the interposer and the board. In another aspect, the CTE of the interposer may be reduced to allow a lower CTE for the substrate, which in turn may reduce thermal strain-induced stress for solder balls between the substrate and a die attached to the substrate. Advantageously, the improved thermal performance of the present invention may allow larger substrates, larger dies, larger solder ball arrays, reduced solder ball pitches and pin counts well above conventional levels without compromising semiconductor device reliability.

In addition to improving thermal performance, the interposer also improves compliance of the semiconductor device to permit larger substrates and increased pin counts. The addition of the interposer to the semiconductor device increases the height between the substrate and the board. By increasing the height, compliance between the substrate and the board is increased. This increased compliance results in lower stresses for peripheral solder balls and thus permit larger solder ball arrays, larger substrates and increased pin counts. The second layer of solder balls and the interposer also adds a second degree of thermal expansion freedom to the package. This second degree of freedom may also improve compliance to reduce stress on peripheral solder balls and thus permit larger solder ball arrays, larger substrates and increased pin counts.

By improving the thermal performance and compliance of the semiconductor package, the interposer permits larger solder ball arrays to be used. The larger solder ball arrays permits a larger substrate, a larger die and an increased pin count for the same solder ball pitch. This advantageously increases I/O for a die connected to the substrate. In addition, the reduced stress decreases the required size of solder balls between the substrate and the board. The decrease in solder ball size may lead to a decrease in solder ball pitch, and thus further increase I/O. Advantageously, the present invention permits pin counts in excess of two thousand pins.

In one aspect, the invention provides an interposer for assembly in a semiconductor device between a packaging substrate and a printed circuit board. The interposer includes an interposer body having a first face and a second face. The interposer also includes an array of conductive links traversing from the first face of the interposer to the second face of the interposer.

In another aspect, the invention provides a semiconductor package. The semiconductor package includes a packaging substrate including a ceramic material. The semiconductor package also includes a die mechanically bound to the packaging substrate and in electrical communication with the packaging substrate. The semiconductor package further includes an interposer mechanically bound and in electrical communication with the packaging substrate, the interposer including an array of conductive links traversing from a first face of the interposer to a second face of the interposer.

In yet another aspect, the invention provides a semiconductor device. The semiconductor device includes a packaging substrate including a ceramic material. The semiconductor device also includes a die mechanically bound to the packaging substrate and in electrical communication with the packaging substrate. The semiconductor device further includes an interposer mechanically bound and in electrical communication with the packaging substrate, the interposer including an array of conductive links traversing from a first face of the interposer to a second face of the interposer. The semiconductor device additionally includes a printed circuit board mechanically bound and in electrical communication with the interposer.

In another aspect, the invention provides a method of fabricating a semiconductor package. The method comprising providing a package including a die bound to and in electrical communication with packaging substrate. The method also including providing a interposer, the interposer including an array of conductive links traversing from a first face of the interposer to a second face of the interposer. The method further including attaching the packaging substrate to the interposer. The method additionally includes attaching said interposer to a printed circuit board.

In yet another aspect, the invention provides a method of fabricating an interposer for use in a semiconductor device including a packaging substrate. The method including providing an interposer material. The method also including forming an array of holes in the interposer material traversing from a first face of the interposer material to a second face of the interposer material. The method further including forming a metal layer in each hole of the array of holes. The method additionally including attaching a first array of solder balls to a first portion of the metal layer for each hole of the array of holes. The method also including attaching a second array of solder balls to a second portion of the metal layer for each hole of the array of holes.

These and other features and advantages of the present invention are described below with reference to the drawings.

BRIEF DESCRIPTION OF THE DRAWINGS

FIG. 1A illustrates a conventional semiconductor device which includes a package attached to a printed circuit board.

FIG. 1B illustrates a ceramic column grid array (CCGA) including colunmns which extend from a substrate to a printed circuit board.

FIG. 2 illustrates a semiconductor package including an interposer in accordance with one embodiment of the present invention.

FIG. 3 illustrates a semiconductor device including an interposer in accordance with one embodiment of the present invention.

FIG. 4A illustrates a cross section of a laminate interposer in accordance with one embodiment of the present invention.

FIG. 4B illustrates a diagrammatic side view of an interposer in accordance with another embodiment of the present invention.

FIG. 5 provides a flowchart for a method of fabricating a semiconductor device in accordance with one embodiment of the present invention.

FIG. 6 provides a flowchart for a method of fabricating an interposer in accordance with one embodiment of the present invention.

DETAILED DESCRIPTION OF PREFERRED EMBODIMENTS

Reference will now be made in detail to preferred embodiments of the invention. Examples of preferred embodiments are illustrated in the accompanying drawings. While the invention will be described in conjunction with these preferred embodiments, it will be understood that it is not intended to limit the invention to any particular preferred embodiment. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

FIG. 2 illustrates a semiconductor package 200 including an interposer 202 in accordance with one embodiment of the present invention. The semiconductor package 200 also includes a substrate 204 mechanically bonded to a die 206. The substrate 204 includes bond pads 208 for receiving solder balls 210. The solder balls 210 provide electrical communication and mechanical attachment between the substrate 204 and the die 206.

Rather than the conventional direct ball bonding from the substrate 204 to a board, the semiconductor package 200 includes two layers of solder balls. A first array of solder balls 212 is situated between the interposer 202 and the substrate 204. The first array of solder balls 212 provide electrical communication and mechanical attachment between the substrate 204 and the interposer 202. A second array of solder balls 214 is situated below the interposer 202 to permit electrical communication and mechanical attachment to a board. The first array of solder balls 212 and the second array of solder balls 214 are connected by conductive links 216. The conductive links 216 traverse the interposer 202 from a surface 218 having the first array of solder balls 212 to an opposite surface 220 having the second array of solder balls 214. A solder ball pitch 222 may be defined as the distance between solder balls of the first array of solder balls 212 or the distance between solder balls of the second array of solder balls 214.

FIG. 3 illustrates a semiconductor device 225 including the interposer 202 in accordance with one embodiment of the present invention. The semiconductor device 225 includes the semiconductor package 200 mounted on a printed circuit board 226. The board 226 includes landings 228 to receive the second array of solder balls 214. After construction of the semiconductor device 225, the solder balls 214 provide electrical communication and mechanical attachment between the interposer 202 and the board 226.

The coefficient of thermal expansion (CTE) for the interposer 202 may vary widely to improve the thermal performance of the semiconductor device 225. In one aspect, the CTE of the interposer 202 may be flexibly selected to reduce stress for one or more of the layers of solder balls in the semiconductor device 225. More specifically, the CTE of the interposer 202 may be flexibly selected to reduce CTE differences between the board 226 and the interposer 202, between the interposer 202 and the substrate 204, and/or between the substrate 204 and the die 206.

In a specific embodiment, the CTE of the interposer 202 may be selected to provide an intermediate CTE between the substrate 204 and the board 202. By way of example, the substrate 204 may be comprised of a ceramic material having a CTE of approximately 6 parts per million (PPM), the board 202 may be comprised of a resin based material having a CTE of approximately 18 PPM, and the CTE of the interposer 202 may be selected to provide an intermediate CTE of approximately 12 PPM.

In one embodiment, the interposer 202 CTE is selected to reduce stress on the second array of solder balls 214 between the interposer 202 and the board 226. This may be accomplished by selecting a CTE for the interposer 202 which reduces the CTE difference between the board 226 and the interposer 202. In some embodiments, the interposer 202 CTE may be any CTE greater than the substrate 204 CTE and less than or equal to the board 226 CTE. Correspondingly, as the interposer 202 CTE is increased, the thermal strain differences between the board 226 and the interposer 202 are reduced, thus reducing stress on the second array of solder balls 214.

In another embodiment, the interposer 202 CTE is selected to reduce stress on the first array of solder balls 212 between the interposer 202 and the substrate 204. This may be accomplished by selecting a CTE for the interposer 202 which reduces the CTE difference between the interposer 202 and the substrate 204. In some embodiments, the interposer 202 CTE may be any CTE less than the board 226 CTE and greater than or equal to the substrate 204 CTE. Correspondingly, as the interposer 202 CTE is decreased, the thermal strain differences between the interposer 202 and the substrate 204 are reduced, thus reducing stress on the first array of solder balls 212.

Reduced stress on the first array of solder balls 212 and/or the second array of solder balls 214 may permit a designer to increase the size of each array of solder balls. Larger allowable sizes for the solder ball arrays 212 and 214 may permit a larger substrate 204 and an increased pin count. Thus, the improved thermal performance provided by the interposer 202 may result in a significantly larger substrate 206 and an increased pin count for the semiconductor device 225. Indeed, substrate 204 sizes in the range of 60–70 mm are suitable for use with the present invention. In addition, pin counts in excess of two thousand pins are also suitable for use with the present invention.

In another embodiment, the CTE of the interposer 202 is selected to reduce the CTE difference between the interposer 202 and the substrate 204 and thereby permit a designer to decrease the CTE of the substrate 204. A smaller substrate 204 CTE will reduce the CTE difference between the substrate 204 and the die 206. Reduced thermal strain differences between the substrate 204 and the die 206 will diminish thermal strain-induced stress on the solder balls 210. With reduced stress on the solder balls 210, the size of the layer of solder balls 210 may be increased. As the layer of solder balls 210 increases in size, the number of solder balls 210 may increase, thereby increasing I/O for the die 206. In addition, as the layer of solder balls 210 increases in size, the die 206 size may increase. By way of example, die sizes in the range of 10 mm to 20 mm may be suitable with the present invention. Thus, the improved thermal performance provided by the interposer 202 may permit a decrease in the CTE of the substrate 204, which permits increased I/O for the die 206 and a larger die 206.

An underfill 230 may be added to the semiconductor package 200. The underfill 230, typically a thermo-set epoxy, is dispensed into the space around the solder balls 212 between the interposer 202 and the substrate 204. Advantageously, the underfill 230 improves the connection and rigidity between the substrate 204 and the interposer 202. The underfill 230 may also act to absorb stresses between the substrate 204 and the interposer 202, thus improving the resistance to stress in the semiconductor package 200. In particular, the added rigidity and material between the interposer 202 and the substrate 204 may substantially decrease any stress on the first array of solder balls 212.

In some embodiments, the interposer 202 CTE may be selected to minimize the stress on the second array of solder balls 214 despite relatively increasing the stress on the first array of solder balls 212. This is the case when the interposer 202 CTE is set greater than the intermediate CTE (the approximate mean CTE between the board 226 and the substrate 204). In other words, the interposer 202 CTE may be selected to diminish the CTE difference between the board 226 and the interposer 202 despite increasing the CTE difference between the interposer 202 and the substrate 204. In embodiments including the underfill 230, the increased stress on the first array of solder balls 212 may be accommodated by the underfill 230.

In one preferred embodiment including the underfill 230, the interposer 202 CTE is matched to the board 226 CTE. This CTE matching between the interposer 202 and the board 226 is designed to minimize thermal performance differences between the interposer 202 and the board 226. However, this matching leaves the full difference in CTE between the board 226 and the substrate 204 upon the first array of solder balls 212. Again, the increased stress produced by the increased CTE difference between the interposer 202 and the substrate 204 may be accommodated by the underfill 230.

In one preferred embodiment, underfill 230 is not provided between the board 226 and interposer 202. During malfunction or maintenance of the semiconductor device 225, the semiconductor package 200 may have to be removed from the board 226 for repair or replacement (i.e. by melting solder connecting the two). However, underfill placed upon the board 226 is generally permanent and may not allow the semiconductor package 200 to be removed. Thus, when underfill is included between he board 226 and interposer 202, malfunction of the semiconductor package 200 may result in discarding of the semiconductor device 225, which may be prohibitively expensive.

Advantageously, the present invention permits the thermal performance differences between the die 206 and the board 226 to be accommodated between two intermediate materials. More specifically, as the die 206 CTE is typically about 2–4 PPM and the board 226 CTE is typically about 18 PPM, the intermediate substrate 204 and the interposer 202 may accommodate the thermal performance differences between the die 206 and the board 226 using two intermediate structures. In a preferred embodiment, the substrate 204 is ceramic. By using a substrate comprised of ceramic as well as an interposer whose CTE is controlled, the thermal differences between adjacent layers may be manipulated to minimize thermal performance limitations on semiconductor design.

By improving the thermal performance of the semiconductor device 225, the interposer 202 permits a larger substrate to be used. The larger substrate permits higher pin counts for the same pitch 222. The present invention may implement substrate and solder ball array sizes well above conventional levels. By way of example, substrate sizes in excess of 50 mm are suitable with the present invention. In addition, substrate sizes in excess of 60 mm are suitable with the present invention. Thus, for the same solder ball pitch, the present invention may allow for an increased number of pins for the semiconductor package 200 and thus increase I/O to the die 206.

In addition to improving thermal performance for the semiconductor device 225, the interposer 202 also improves compliance of the semiconductor device 225 to permit larger substrates and increased pin counts. The addition of the interposer 202 to the semiconductor device 225 increases the height between the substrate 204 and the board 226. By increasing the height, flexibility between the substrate 204 and the board 226 is increased. By way of example, a conventional solder ball array between a board and a substrate has a height of approximately 30 mils. Alternatively, for an interposer 202 having a thickness of about 20 mils and two solder ball arrays of 30 mils, the height between the board 226 and the substrate 204 will be 80 mils. The increased flexibility between the board 226 and the substrate 204 decreases the stress on the solder balls. This in turn allows for solder balls to be placed at increasing distances from the neutral point of thermal expansion, and allows for a larger substrate and increased pin count. Generally speaking, the layered construction of the present invention may range from 26 mils to 70 mils in height.

The interposer 202 and the second array of solder balls 214 also improves compliance for the semiconductor device 225 by adding a second degree of thermal expansion freedom. This second degree of freedom may also improve flexibility between the board 226 and the substrate 204 to remediate thermal stresses on peripheral solder balls. Similarly, the reduced stresses may permit larger solder ball arrays, a larger substrate and an increased pin count.

As the present invention reduces the stresses in the different layers of solder balls, smaller solder balls may be used. The use of smaller solder balls may reduce the pitch between solder balls in the layer of solder balls 210, the first array of solder balls 212 and the second array of solder balls 214. By way of example, a solder ball pitch 222 of 1 mm is suitable for the present invention. The smaller solder balls and reduced pitch may then increase the number of pins for the substrate 204 and thus further increase I/O for the die 206. With a solder ball pitch of 1 mm, pin counts in excess of 2000 pins are possible with the present invention.

The materials and composition used in the semiconductor device 225 may vary widely. The board 226 may comprise a laminate or organic material, such as fiber glass, PTFE (such as Teflon™, available from Gore, Eau Claire, WI) BT Resin, epoxy laminates or ceramic-plastic composites. More specifically, the board 226 may comprise glass filler deposited in resin in the range of 30–70% glass filler. The underfill 230 may be a thermo-set epoxy, such as is available from Hysol Corporation of Industry, California (product numbers 4511 and 4527), Ablestik Laboratories of Rancho Domingo, Calif., and Johnson Matthey Electronics of San Diego, Calif. However, numerous underfill materials are known in the art and any suitable underfill material may be used.

The solder composition of the first array of solder balls 212 and the second array of solder balls 214 may vary. More specifically, the solder composition of each may vary to provide different melting points between the two arrays. In some embodiments, compositions for the first array of solder balls 212 and the second array of solder balls 214 are selected to create a melting point hierarchy. By way of example, the second array of solder balls 214 may have a melting point greater than that of the first array of solder balls 212. In one embodiment, the second array of solder balls 214 may have a melting point in the range of 170 to 330 degrees Celsius and the first array of solder balls 212 may have a melting point in the range of 170 to 220 degrees Celsius. By way of example, the second array of solder balls 214 between the interposer 202 and the board 226 may have a melting point of about 280 degrees Celsius and the first array of solder balls 212 between the interposer 202 and the substrate 204 may have a melting point of about 183 degrees Celsius. The solder composition for each array of solder balls may vary to accomplish this melting point hierarchy. By way of example, solder balls in the first array of solder balls 212 may comprise 63% tin and 37% lead (e.g., eutectic solder) to produce a melting point of about 183 degrees Celsius. Alternatively, solder balls in the second array of solder balls 214 may comprise 90% tin and 10% lead to produce a melting point of about 280 degrees Celsius. The melting point hierarchy may be advantageous during construction of the semiconductor package 200.

The landings 228 of the board may also include solder paste 232 to permit attachment of the semiconductor package 200 to the board 226. In another embodiment, the solder composition of the first array of solder balls 212 and the second array of solder balls 214 is selected such that both have a melting temperature greater than the solder paste 232. In this manner, upon attachment of the semiconductor package 200 to the board 202 during reflow, the reflow temperature may be controlled such that the solder paste 232 melts and not either of the solder ball arrays 212 and 214. By way of example, the solder paste 232 may comprise 63% tin and 37% lead (e.g., eutectic solder) to produce a melting point of about 183 degrees Celsius. In some embodiments, the second array of solder balls 214 does not melt and thus the solder paste 232 conforms to provide mechanical connection with the second array of solder balls 214.

Typically, the materials and composition for the interposer 202 are selected such that the interposer 202 provides a desired CTE. The interposer 202 CTE may be realized in a number if manners. In one embodiment, the interposer 202 is a single material. By way of example, Fr4 having a CTE in the range of 14 to 20 PPM is suitable for use with the present invention. Alternatively, the interposer 202 may include a plurality of materials. In some embodiments, the interposer 202 may be a laminate of two or more materials designed to have a desired total CTE for an application.

FIG. 4A illustrates a cross section of a laminate interposer 400 in accordance with one embodiment of the present invention. The laminate interposer 400 is illustrated before assembly into a semiconductor package and is suitable for assembly with the semiconductor package 200. The laminate interposer 400 includes a base substrate 402. Within the base substrate 402 are a number of intermediate layers. A first intermediate layer 404 is provided within the base substrate 402. Above and below the first intermediate layer 404 are second and third intermediate layers 406 and 408 respectively.

The laminate interposer 400 includes an array of holes such as hole 410. Lining the hole 410 is a plating layer 412. The plating layer 412 provides electrical communication from a top surface 414 of the laminate interposer 400 to an opposite surface 416. Solder ball 418 is attached at the top surface 414 of the laminate interposer 400 and contacts at least a portion 420 of the plating layer 412. Solder ball 422 is attached at the bottom surface of the laminate interposer 400 and contacts at least a separate portion 424 of the plating layer 412. In some embodiments, the hole 410 is filled with solder to prevent the presence of any voids therein.

As shown in FIG. 4A, the laminate layers 404, 406 and 408 may not extend through the base substrate 402 to contact the plating layer 412. This is often the case when the laminate layers 404, 406 and 408 are conductive in order to prevent shorting of the plating layer 412. In other words, for metal or other conductive laminate layers in the laminate interposer 400, a clearance 426 may be maintained so as to prevent contact with the plating layer 412.

The materials and composition of the laminate interposer 400 may be variably selected and adapted to provide a wide range of coefficients of thermal expansion for the laminate interposer 400. Laminate layers provided in the laminate interposer 400 may include one or more layers of the same material, or different materials. Suitable materials for use as laminate layers include copper, Invar (FE-Ni), or any metal alloy having a suitable CTE, for example.

In some embodiments, the laminate interposer 400 only includes the base substrate 402 and the intermediate layer 404. By way of example, the base substrate 402 may be comprised of Fr4 and the intermediate layer 404 comprised of copper. In this case, the CTE of the laminate interposer 400 may have a CTE in the range of 10 to 14 PPM. In a specific embodiment, the laminate interposer 400 includes the base substrate 402 comprised of Fr4 and the intermediate layer 404 comprised of copper having a CTE of 18 PPM.

Alternatively, the laminate interposer 400 may include the base substrate 402, the two intermediate layers 406 and 408 and the intermediate layer 404. By way of example, the base substrate 402 may be comprised of as Fr4, the two intermediate layers 406 and 408 may be comprised of copper and the intermediate layer 404 may be comprised of Invar. In this case, the laminate interposer 400 may have a CTE in the range of 10 to 12 PPM. In a particular embodiment, the laminate interposer 400 may have a CTE of about 12 PPM. Of course, the thickness and dimensions for the laminate layers 404, 406 and 408 may be adapted to alter the CTE for the laminate interposer 400.

FIG. 4B illustrates a diagrammatic side view of an interposer 430 in accordance with another embodiment of the present invention. The interposer 430 includes a base substrate 432. The interposer 430 also includes an array of laser cut holes such as hole 434. Lining the hole 434 is a plating layer 436. The diameter of the hole 434 is such that the plating layer 436 fills the hole 434. In this case, solder balls 438 and 440 may applied on either side of the interposer 430 and solder does not enter the hole 434. By way of example, a hole 434 diameter in the range of 20–50 microns is suitable for the interposer 430. By using a laser-formed via instead of a mechanically drilled hole, and then filling the hole 434 with copper from the plating layer 436, the diameter of the hole 434 may be decreased relative to that of FIG. 4A. In this manner, finer pitch holes may be used to increase the pin count for a substrate. In one embodiment, the base substrate 432 is comprised of Fr4 and the interposer 430 as a CTE about 18 PPM. Alternatively, the base substrate 432 may be pre-prag or any glass fiber impregnated with a resin.

FIG. 5 provides a flowchart 500 for a method of fabricating a semiconductor device in accordance with one embodiment of the present invention. Processes in accordance with the present invention may include up to several additional steps not described or illustrated here in order not to obscure the present invention.

The flowchart 500 starts by receiving a package (502). The package may be any conventionally fabricated package including a die and a substrate. An interposer is then received (504). Typically, the interposer is pre-cut based on a known geometry of the substrate. More specifically, the interposer may shaped and drilled before assembly in the flowchart 500. In addition, two arrays of solder balls may already formed on the interposer. In one embodiment, the first array of solder balls has a melting point at eutectic temperatures while the second array of solder balls has a higher melting point. Alternatively, the substrate may be provided with an array of solder balls on its underside for attachment to the interposer.

The interposer is then attached to the substrate of the package (506). In some embodiments, this includes reflowing an array of solder balls between the substrate and the interposer having a first melting point. Underfill may also be added after the reflow to increase the rigidity between the substrate and the interposer. The underfill may also act to contain the array of solder balls during subsequent reflow operations. If a second array of solder balls was not provided on the interposer for attachment to a board, they may be attached to the interposer at this point.

Subsequently, a board is received (510). To permit subsequent attachment of the substrate to the board, solder paste may be screen printed on the board (512). In some embodiments, the solder paste is selected such that it has a melting temperature below the one or both arrays of solder balls attached to the interposer. In a specific embodiment, the solder paste is selected such that it has a melting temperature that matches the melting point of the array of solder balls between the substrate and the interposer. By way of example, the solder paste and the array of solder balls between the substrate and the interposer may consist of a eutectic solder paste (63% tin, 37% lead) which melts at 183 degrees Celsius.

The substrate is then attached to the board (506). This is accomplished by reflowing the board and the package in a reflow oven. The reflow temperature may be set such that it melts the solder paste and not any solder balls in the package. Alternatively, the array of solder balls between the interposer and the substrate may have a melting temperature about the same as or less than that of the solder paste. In this case, underfill may be included in package between the substrate and the interposer to contain the solder during reflow.

FIG. 6 provides a flowchart 600 for a method of fabricating an interposer in accordance with one embodiment of the present invention. Processes in accordance with the present invention may include up to several additional steps not described or illustrated here in order not to obscure the present invention.

The flowchart 600 starts by receiving an interposer material (602). The interposer material may be a single layer of Fr4 or a single layer of pre-preg, for example. Alternatively, the interposer material may be a laminate having multiple layers of two or more materials. The interposer material or materials are then shaped to size (604). Shaping a laminate interposer may include sizing each laminate layer relative to other layers as well as sizing each laminate layer to a solder ball array pitch on the substrate. Sizing each laminate layer may accommodate a clearance between a metal laminate layer and a hole to be added in the base substrate. The interposer may then be sized according to an application, e.g., machined to a similar shape of a substrate. In one embodiment, a laminate interposer may be pre-assembled. More specifically, the pre-assembly may include cutting and drilling laminate layers and base substrate layers. Generally, the dimensions of the interposer material and laminate layers will be customized according to the substrate and board that the interposer will be subsequently attached to.

An array of holes are then formed in the interposer material (606). In one embodiment, the holes are mechanically drilled. By way of example, the holes may be mechanically drilled with a hole diameter of 100 to 200 microns. In another embodiment, the holes are laser cut. In this case, the holes may have a diameter range from about 20 to 50 microns and a 1 mm pitch. In yet another embodiment, the holes are pre-punched. In this case, the holes may have a diameter range from about 150 to 400 microns. Typically, the hole pattern and pitch will be formed relative to on the pattern and pitch provided on a substrate or board which the interposer will be attached to.

After the holes are established, the holes are metallized (608). Metallizing the holes includes plating the hole with a standard copper, for example, according to conventional standards and methods. Plating the holes may also include soaking the interposer material in an activator material to enhance adherence of the plating material. After the metallization layer has been added, a first array of solder balls is attached to the interposer on a first face (610). In addition, a second array of solder balls is attached to the interposer on an opposite face to the first face (612). Either solder ball array may be attached first. In one embodiment, the two arrays of solder balls have different melting points. In this case, the solder ball array having the higher melting point is attached first so as to plug the hole while the lower melting point solder is added. In some embodiments, a sufficient amount of the lower melting point solder is added to sufficiently fill the hole in order to prevent the formation of voids in the hole.

By using an interposer whose CTE may be specified for an application, the thermal differences between adjacent layers of a semiconductor package may be manipulated to minimize thermal performance limitations on semiconductor design. As a result, the present invention improves the thermal performance and compliance of a semiconductor device, permitting larger ball bond arrays and a larger substrate to be used. The larger substrate permits higher pin counts for the same pitch. This advantageously increases I/O for a die in a semiconductor package. By reducing stresses on solder balls in the semiconductor device, the present invention also allows for a smaller pitch between solder balls. This further increases I/O for a die in a semiconductor package. Advantageously, the improved thermal performance of the present invention may allow larger substrates, larger dies, larger solder ball arrays, reduced solder ball pitches and pin counts well above conventional levels without compromising semiconductor device reliability.

Although the foregoing invention has been described in some detail for purposes of clarity of understanding, it will be apparent that certain changes and modifications may be practiced within the scope of the appended claims. By way of example, a conventional stiffener and heat spreader may be added to the semiconductor package 200. In addition, although a flip chip is illustrated, any type of chip may be included in the semiconductor package 200. It should be noted that there are many alternative ways of implementing both the process and apparatuses of the present invention. Accordingly, the present embodiments are to be considered as illustrative and not restrictive, and the invention is not to be limited to the details given herein, but may be modified within the scope and equivalents of the appended claims.

What is claimed is:

1. A semiconductor package, comprising:
   a packaging substrate including a ceramic material;
   a die mechanically bound to said packaging substrate and in electrical communication with said packaging substrate;
   an interposer mechanically bound and in electrical communication with said packaging substrate, said interposer including an array of conductive links traversing from a first face of said interposer to a second face of said interposer; and
   an underfill material deposited at least partially between said packaging substrate and said interposer.

2. The semiconductor package of claim 1, wherein said interposer has a coefficient of thermal expansion greater than that of said packaging substrate.

3. The semiconductor package of claim 1, wherein said packaging substrate has a side greater than 50 mm.

4. The semiconductor package of claim 1, wherein said interposer has a coefficient of thermal expansion less than that of a board attached to said interposer.

5. The semiconductor package of claim 4, wherein said interposer has a coefficient of thermal expansion of between about 2 PPM and 18 PPM.

6. The semiconductor package of claim 1, wherein said array of conductive links includes greater than two thousand conductive links.

7. The semiconductor package of claim 1, further including a first array of solder balls attached to said array of conductive links at said first face of said interposer and attached to said packaging substrate.

8. The semiconductor package of claim 7, further including a second array of solder balls attached to said array of conductive links at said second face of said interposer.

9. The semiconductor package of claim 1, wherein said interposer is a laminate including said a base substrate and a first intermediate layer.

10. The semiconductor package of claim 9, further including a second intermediate layer.

11. The semiconductor package of claim 1, wherein said interposer has a coefficient of thermal expansion matched to the coefficient of thermal expansion for a board mechanically coupled to said interposer.

12. A semiconductor device, comprising:
   a packaging substrate including a ceramic material;
   a die mechanically bound to said packaging substrate and in electrical communication with said packaging substrate;
   an interposer mechanically bound and in electrical communication with said packaging substrate, said interposer including an array of conductive links traversing from a first face of said interposer to a second face of said interposer;
   a printed circuit board mechanically bound and in electrical communication with said interposer; and
   an underfill material deposited at least partially between said packaging substrate and said interposer.

13. The semiconductor device of claim 12, wherein said interposer has a coefficient of thermal expansion greater than the coefficient of thermal expansion for said packaging substrate.

14. The semiconductor device of claim 12, wherein said interposer has a coefficient of thermal expansion less than the coefficient of thermal expansion than said printed circuit board.

15. The semiconductor device of claim 12, wherein said interposer has a coefficient of thermal expansion matched to the coefficient of thermal expansion for said board.

16. The semiconductor package of claim 12, wherein said array of conductive links includes greater than two thousand conductive links.

17. The semiconductor package of claim 12, further including a first array of solder balls attached to said array of conductive links at said first face of said interposer.

18. The semiconductor package of claim 17, further including a second array of solder balls attached to said array of conductive links at said second face of said interposer.

* * * * *